United States Patent [19]

Hoshino

[11] Patent Number: 4,985,750
[45] Date of Patent: Jan. 15, 1991

[54] SEMICONDUCTOR DEVICE USING COPPER METALLIZATION

[75] Inventor: Kazuhiro Hoshino, Tokyo, Japan

[73] Assignee: Fujitsu Limited, Kawasaki, Japan

[21] Appl. No.: 97,738

[22] Filed: Sep. 17, 1987

[30] Foreign Application Priority Data

Sep. 17, 1986 [JP] Japan .................. 61-218302

[51] Int. Cl.$^5$ .................. H01L 23/48; H01L 29/46; H01L 29/54
[52] U.S. Cl. .................. 357/71; 357/67; 357/68
[58] Field of Search .................. 357/71, 67, 68

[56] References Cited

U.S. PATENT DOCUMENTS

| | | | |
|---|---|---|---|
| 4,109,372 | 8/1978 | Geffken | 357/67 S |
| 4,141,020 | 2/1979 | Howard et al. | 357/67 |
| 4,141,022 | 2/1979 | Sigg et al. | 357/71 S |
| 4,201,999 | 5/1980 | Howard et al. | 357/67 |
| 4,206,472 | 6/1980 | Chu et al. | 357/71 S |
| 4,206,540 | 6/1980 | Gould | 357/71 S |
| 4,214,256 | 7/1980 | Dalal et al. | 357/71 S |
| 4,263,606 | 4/1981 | Yorikane | 357/71 |
| 4,272,561 | 6/1981 | Rothman et al. | 357/71 |
| 4,640,004 | 2/1987 | Thomas et al. | 357/71 |

OTHER PUBLICATIONS

Patent Abstracts of Japan, vol. 9, No. 75 (E-306 [1798], 4th Apr. 1985; & JP-A-59 210 656 (Fujitsu K.K.) 29-1-1-84.
IBM Technical Disclosure Bulletin, vol. 29, No. 3, Aug. 1986, pp. 1395, 1396, New York, US; "Diffusion Barriers for CU".
IBM Technical Disclosure Bulletin, vol. 25, No. 2, Jul. 1982, pp. 591–592, New York, US; R. C. Lange et al.: "Process for Forming a Contact Hole Stud".

Primary Examiner—Rolf Hille
Assistant Examiner—Robert P. Limanek
Attorney, Agent, or Firm—Staas & Halsey

[57] ABSTRACT

A semiconductor device comprises a silicon substrate, an insulating film in which a contact hole is formed, a metallic layer deposited on said silicon substrate through the contact hole, for forming an ohmic contact to the silicon substrate, a barrier layer deposited on the metallic layer, for preventing reaction and interdiffusion between copper and silicon, and a metallization film including at least copper deposited on the barrier layer.

13 Claims, 1 Drawing Sheet

SEMICONDUCTOR DEVICE USING COPPER METALLIZATION

CROSS-REFERENCE TO RELATED APPLICATIONS

The subject matter of this application is related to copending application nos. 097,739 filed Sept. 17, 1987 and 097,741 filed Sept. 17, 1987.

BACKGROUND OF THE INVENTION

The present invention generally relates to semiconductor devices, and in particular to semiconductor devices using copper or copper alloy as a wiring or metallization material.

It is known that a metallization pattern of a large scale integrated circuit (LSI) diminishes in width as its integration density increases. Although aluminum (Al) metallization is widely used for semiconductor chips, its width for metallization is limited to the range of 0.5 to 0.6 μm. This is because the electromigration increases occurs as the aluminum metallization pattern becomes narrower. For these reasons, the use of a metallic material of a high melting point such as molybdenum (Mo) or tungsten (W) in place of Al has been considered. However, the resistivity of Mo or W is approximately twice the resistivity of Al in bulk and is more in a thin film. Therefore, a need exists for a metallization material having high electromigration resistance and low resistivity.

Presently, copper (Cu) is being investigated for metallization of LSIs due to its better electromigration resistance and lower resistivity than Al. A conventional semiconductor device with copper metallization is designed so that a copper metallization film is directly deposited on an insulating film such as silicon dioxide ($SiO_2$) film which is deposited on a silicon (Si) substrate and over contact holes formed in the insulating film so as to be positioned on diffused layers formed in the Si substrate. The copper film is then patterned in accordance with a wiring pattern. The semiconductor device thus configured is then generally annealed at a high temperature on the order of 400° C. or over in order to grow grains of Cu and thereby improve the electromigration resistance.

However, the conventional semiconductor device with Cu metallization film mentioned above has a disadvantage that reaction and interdiffusion between Cu in the metallization film and Si included in the substrate, or Cu in the metallization film and Si in the insulating film occur during a heat treating process such as annealing. This is because the Cu metallization film is directly in contact with the Si substrate at the through holes in the insulating film. Reaction and interdiffusion cause an increase in the contact resistance and degradation of the Cu metallization. For these reasons, a need exists for preventing the reaction and interdiffusion between Cu and Si.

SUMMARY OF THE INVENTION

Accordingly, a general object of the present invention is to provide a novel and useful semiconductor device, in which the above problems have been eliminated.

A more specific object of the present invention is to provide a semiconductor device, in which reaction and interdiffusion between copper included in a metallization film and silicon in a substrate or copper in a metallization film and silicon in an insulating layer can be effectively prevented.

Another object of the present invention is to provide a semiconductor device, in which a low resistivity ohmic contact is made between a copper metallization film and a silicon substrate.

Yet another object of the present invention is to provide a semiconductor device, having a low resistance metallization film including copper as at least one constituent.

A further object of the present invention is to provide a semiconductor device, in which a leakage current which flows from a diffused layer formed in a silicon substrate is limited.

To attain the above-mentioned objects and features, the present invention provides a semiconductor device comprising a silicon substrate, an insulating film in which a contact hole is formed, a metallic layer deposited on the silicon substrate through the contact hole for forming an ohmic contact to the silicon substrate, a barrier layer deposited on the metallic layer for preventing reaction and interconnection between copper and silicon, and a metallization film including copper, as at least one constituent, deposited on the barrier layer.

Other objects and further features of the present invention will be apparent from the following detailed description when read in conjunction with the attached drawings.

BRIEF DESCRIPTION OF THE DRAWINGS

FIG. 3 is a graph showing resistivity versus thickness of titaninum nitride to illustrate the advantages provided according to the present invention;

FIGS. 4A and 4B are comparative graphs showing generation of a leakage current in samples of a conventional semiconductor device and a semiconductor device according to the present invention, respectively;

FIG. 4C is an elevational cross sectional view of the semiconductor devices of the type which were used to obtain the leakage current measurements devices of FIG. 4A and FIG. 4B;

FIG. 5A is a graph of depth profiles, as deposited and after annealing, of elements in a sample of a semiconductor device according to the present invention;

FIG. 58 is an elevational cross sectional view of the sample which was used obtain the depth profile measurements of FIG. 5A; and FIG. 6 is graphs of depth profiles of elements in the sample of a semiconductor device shown in FIG. 5B but with the Cu film etched off.

DETAILED DESCRIPTION OF THE PREFERRED EMBODIMENTS

Figure 1:
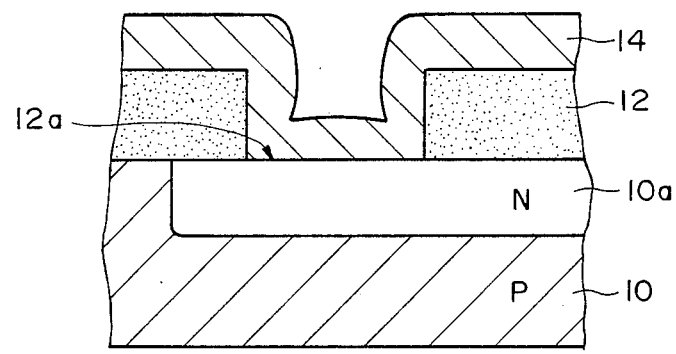
FIG. 1 is an elevational cross sectional view of a conventional semiconductor device having a copper metallization film.

A description is now given of a conventional semiconductor device with a copper metallization film by referring to FIG. 1.

In FIG. 1 an insulating film 12 such as $SiO_2$ is deposited on the top of a p-type silicon substrate 10. A contact hole 12a is formed in the insulating film 12 so as to be positioned on an n+-diffused layer 10a. A copper metallization film 14 is directly deposited on the insulating layer 12 and over the contact hole 12a in accordance with a wiring pattern.

The semiconductor device of FIG. 1 is then by heat-treated annealing. During the heat treatment, the Cu atoms diffuse into the n+-diffused layer 10a and into the p-type silicon substrate 10, and Si atoms migrate to the Cu metallization film 14. The diffusion of the Cu atoms causes not only an increase in the contact resistance and but also the generation of a leakage current from the n+-diffused layer 10a to the p-type silicon substrate 10. On the other hand, migration of the Si atoms to the Cu metallization film 14 causes an increase in the resistance of the Cu metallization film 14 due to the presence of Si thereon. This degrades the electrical conductivity of the Cu metallization film 14.

The present invention eliminates the above problems.

Figure 2:
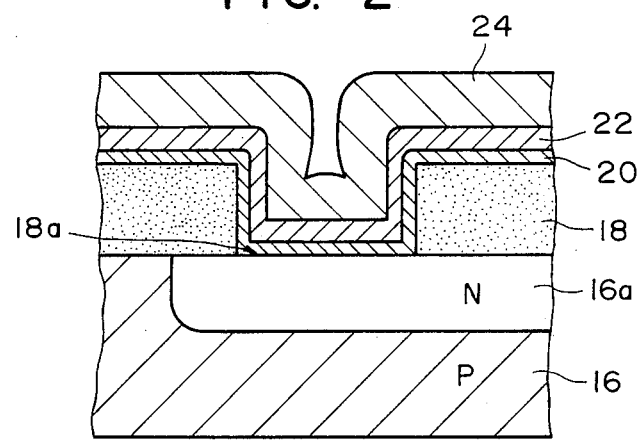
FIG. 2 is an elevational cross sectional view of an embodiment of a semiconductor device according to the present invention.

A description is now given of an embodiment of a semiconductor device according to the present invention with reference to FIG. 2.

In FIG. 2, an insulating film 18, such as $SiO_2$, is deposited on the top of a p-type silicon substrate 16. Silicon nitride ($Si_3N_4$) or phosphor-silicate glass (PSG) may be employed to form the insulating film 18. Contact hole 18a is formed in the insulating film 18 so as to be positioned on an n+-diffused layer 16a in the p-type silicon substrate 16.

A metallic layer 20 is deposited on the insulating film 18 and on the top of the n+-diffused layer 16a in the Si substrate 16 through the contact hole 18a. The metallic layer 20 may be made of Ti, Al or platinum (Pt), for example. When using Ti, deposition of the Ti metallic layer 20 may be carried out by a D.C. magnetron sputtering method in which a Ti target is sputtered in the presence of argon (Ar) gas at a pressure of 5 mTorr with a power of D.C.2kW. The film thickness of the metallic layer 20 is preferably in the range of 100 Å to 1,000Å. The metallic layer 20 is provided to form an ohmic contact of low resistance with the Si substrate 16. That is, when using Ti, titanium silicide ($TiSi_2$) produced by the application of heat makes a low-resistance contact. Therefore, it is enough to deposit the metallic layer 20 on the top of n+-diffused layer 16a in the silicon substrate 16 through the contact hole 18a. However, it is preferable to further deposit the metallic layer 20 on the insulating film 18 in accordance with the metallization pattern in light of the reduction of the number of the manufacturing processes.

A barrier metallic layer 22 is deposited on the metallic layer 20. The barrier layer 22 has the same pattern as a Cu metallization layer 24, which will be described in detail later. In other words, the barrier layer 22 underlies the Cu metallization layer 24. The barrier layer 22 prevents the reaction and interdiffusion between the Cu metallization film 24 and the Si substrate 16 and also between the former and the insulating film 18. In detail, the barrier layer 22 prevents not only the Cu atoms from diffusing into the Si substrate 16 and the insulating film 18 but also the Si atoms from migrating to the Cu metallization film 24. The barrier layer 22 may be made of titanium nitride (TiN), tungsten (W), tungsten nitride (WN), zirconium nitride (ZrN), titanium carbide (TiC), tungsten carbide (WC), tantalum (Ta), tantalum nitride (TaN) or titanium tungsten (TiW). The film thickness of the barrier layer 22 is preferably in the range of 500 Å to 3,000 Å. The barrier layer 22 may be deposited by means of a reactive magnetron sputtering method. For example, a target of Ti is sputtered in the presence of $Ar+N_2$ gas at a pressure of 5 mTorr with a power of D.C.4 kW.

The Cu metallization film 24 is deposited on the barrier layer 22. The Cu metallization film 24 may be deposited by means of the D.C. magnetron sputtering method. For example, a target of Cu is sputtered in the presence of Ar gas at a pressure of 5 mTorr with a power of D.C.2 kW. The film thickness of Cu is preferably in the range of 3,000 Å to 2 μm. It is also possible to use in place of Cu, an alloy of Cu such as Cu—Ti or Cu—Zr as a material forming the metallization film 24 which is to be deposited on the diffusion barrier layer 22.

The metallic layer 20, the barrier layer 22 and the Cu metallization film 24 are patterned in accordance with a wiring pattern. Patterning these layers may be performed by the following steps. First, a mask layer of PSG or TiN, for example, is deposited on top of the Cu metallization film 24 by a reactive magnetron sputtering method. Secondly, a resist layer is patterned on top of the mask layer. Then, the mask is etched off by a reactive ion etching process. Thereafter, the resist ashing is carried out. Next, the Cu metallization film 24 is etched off and thus patterned by an ion milling process by using the patterned mask layer of PSG or TiN. Finally, the underlying metallic layer 20 and the barrier layer 22 are etched off together with the mask by the reactive ion etching process.

A description is now given of experimental results of the semiconductor device of a preferred embodiment by referring to FIGS. 3 through 6.

FIG. 3 shows variations in resistivity (μΩcm) of a TiN/Cu bilayer as a function of the thickness (μm) of the TiN barrier layer. Plots relative to a solid line denote the resistivity of an as-deposited TiN/Cu bilayer, while plots relative to a broken line represent the resistivity of an annealed TiN/Cu bilayer. The annealing was carried out at a temperature of 450° C. for 30 minutes. The Cu metallization film used in the experiment was 0.7 μm in thickness. The experimental results reveal that the resistivity of the as-deposited bilayer hardly varies with variation in the thickness of the TiN layer, whereas the resistivity of the annealed bilayer is considerably increased when d=0, or no TiN film is provided, that is, the Cu metallization film is directly in contact with Si. This means that in this case, reaction and interdiffusion between Cu and Si has occurred. Also, the experimental results reveal that a thickness of at least 0.1 μm of the TiN barrier layer is sufficient for preventing the reaction and interdiffusion and thus to obtain a low-resistance Cu metallization. It should be noted that degradation in the resistance of the Cu metallization film is conspicuous when no barrier layer is provided. This does not apply to Al metallization. That is, the metallization resistance of Al is not considerably degraded due to the migration into and resultant presence of Si in Al metallizations. When depositing the Cu film directly on the Si substrate, Cu at a contact surface is changed into a Cu-Si alloy because of the heat treatment. Since the resistance of the Cu-Si alloy is relatively low, the high contact resistance between Cu and Si increases. In contrast, when depositing Al on the Si substrate, Si is deposited at the contact surface because of the heat treatment. Since the resistance of Si is high, the contact resistance correspondingly increases. Therefore, the presence of TiN is very important in order to obtain low-resistance Cu metallizations.

FIGS. 4A and 4B respectively show values of leakage currents measured in an Al—Si metallization and a Cu metallization. The experiment was effected by using twenty $p^{--n+}$ diodes for the leakage current measurements, the cross section of a representative diode being illustrated in FIG. 4C. Reference numeral 26 represents alternatively, an Al-Si layer or a Ti/TiN/Cu trilayer. A potential difference was applied in the reverse direction to the p-n junction. The experimental results clearly show that the leakage current for the Cu metallization is substantially equivalent to the leakage current for the Al-Si metallization. This reveals that the junction leakage current can be limited within an acceptable range. It will therefore be understood from the above discussion that TiN is effective as a diffusion barrier for Cu. The effectiveness of TiN as the diffusion barrier for the reaction and interdiffusion was confirmed by another experiment, the results of which are illustrated in FIG. 5.

FIG. 5A shows depth profiles of elements (Cu, Ti, Si and N) in each of as-deposited and annealed Si-Sub/-Ti/TiN/Cu films, the cross section of which is illustrated in FIG. 5B. The annealing process was carried out at a temperature of 450° C. for 30 minutes. In the illustrated graphs, the horizontal axis represents sputtering time (min), while the vertical axis denotes intensity (arbitrary units). The primary ions were sputtered onto the top of the Cu film. The intensity was monitored by the use of a secondary ion mass spectrometer (SIMS). The graphs confirm that diffusion of Cu into Si and also diffusion of Si into Cu have effectively been prevented.

In order to further confirm non-existence of Cu in Si, a Si-Sub/Ti/TiN structure which was formed by etching off the Cu film of the structure shown in FIG. 5B was analyzed by means of the SIMS. FIG. 6 shows depth profiles of elements starting from TiN, in each of as-deposited (i.e., "as-depo.") and annealed (i.e., "450°C. ") Si-Sub/Ti/TiN/Cu (Cu has been etched off) films. The experimental results show that no Cu profile exists in the films. Therefore, it may be understood that diffusion of Cu into the Si film has been totally prevented by the presence of the TiN barrier layer. The graph of "Ref. in FIG. 6 represents the experimental result for a Si-Sub/Ti/TiN film in which Cu was not originally deposited on the Cu layer, as a reference for comparison.

The contact resistances of an Al metallization and a Cu metallization with respect to Si were measured. The sample with the Cu metallization used in the experiment had a Si-Sub/Ti/TiN/Cu structure, whereas the sample with the Al metallization had Si-Sub/Al—Si. Both the samples were annealed at a temperature of 450° C. for 30 minutes. The measured contact resistances of the Al—Si and Ti/TiN/Cu metallizations were respectively $1.4 \times 10^{-6}$ cm$^2$ and $1.2 \times 10^{-6}$ cm$^2$. This reveals that the contact resistance of the Cu metallization is substantially equal to that of the Al metallization.

As discussed in the foregoing, according to the present invention, it is possible to prevent the reaction and interdiffusion between the metallization film including Cu (e.g. film 24) and both of a substrate and an insulating film including Si (e.g., substrate 16 and film 18)due to the presence of the barrier layer (e.g., layer 22) positioned therebetween. In addition, the presence of the metallic layer (e.g., layer 20) deposited over the contact holes can form a low contact resistance. It should be noted that if the barrier layer is directly deposited on the Si substrate, the contact resistance would be extremely degraded. In this respect, it is important to deposit the metallic layer on the Si substrate through the contact holes and to deposit the barrier layer on the metallic layer.

The present invention is not limited to the embodiments, but various variations and modifications may be made without departing from the scope of the present invention.

What is claimed is:
1. A semiconductor device comprising:
   a silicon substrate having a main surface;
   an insulating film deposited on the main surface of said silicon substrate and having at least one contact hole extending therethrough exposing the underlying main surface of the silicon substrate;
   a non-copper containing metallic layer deposited on the main surface of said silicon substrate exposed through said contact hole, and forming an ohmic contact to said silicon substrate;
   a non-copper containing barrier layer deposited on said metallic layer, the barrier layer comprising a material which prevents reaction and interdiffusion between copper and silicon; and
   a metallization film comprising copper as a major component deposited on said barrier layer.
2. A semiconductor device as claimed in claim 1, wherein said barrier layer comprises a material selected from the group consisting of titanium nitride, tungsten, tungsten nitride, zirconium nitride, titanium carbide, tungsten carbide, tantalum, tantalum nitride and titanium tungsten.
3. A semiconductor device as claimed in claim 1, wherein said metallization film comprises a material selected from the group consisting of copper, a copper-titanium alloy and a copper-zirconium alloy.
4. A semiconductor device as claimed in claim 1, wherein said metallic layer comprises a material selected from the group consisting of titanium, aluminum and platinum.
5. A semiconductor device as claimed in claim 1, wherein the thickness of said barrier layer is in the range of 500 Å to 3,000 Å.
6. A semiconductor device as claimed in claim 1, wherein the thickness of said metallic layer is in the range of 100 Å to 1,000 Å.
7. A semiconductor device as claimed in claim 1, wherein the thickness of said metallization film is in the range of 3,000 Å to 2 μm.
8. A semiconductor device as claimed in claim 1 wherein the metallic layer comprises titanium, the barrier layer comprises titanium nitride, and the metallization film comprises copper.
9. A semiconductor device as claimed in claim 1, wherein the silicon substrate includes a n+ layer, and wherein the metallic layer is deposited on top of the n+ layer of the silicon substrate.
10. A semiconductor device as claimed in claim 1 wherein the metallic layer is deposited on said silicon substrate through said at least one contact hole and is deposited on top of the insulating film.
11. A semiconductor device as claimed in claim 1 wherein the insulating film includes silicon.
12. A semiconductor device comprising:
   a silicon substrate having a main surface;
   an insulating film deposited on the main surface of said silicon substrate and having at least one contact hole extending therethrough exposing the underlying main surface of the silicon substrate;

a non-copper containing metallic layer deposited on the main surface of said silicon substrate exposed through said contact hole, and forming an ohmic contact to said silicon substrate;

a non-copper containing barrier layer deposited on said metallic layer, the barrier layer comprising a material which prevents reaction and interdiffusion between copper and silicon; and a copper metallization film deposited on said barrier layer.

13. A semiconductor device comprising:

a silicon substrate having a main surface;

an insulating film deposited on the main surface of said silicon substrate and having at least one contact hole extending therethrough exposing the underlying main surface of the silicon substrate;

a non-copper containing metallic layer deposited on the main surface of said silicon substrate exposed through said contact hole, and forming an ohmic contact to said silicon substrate;

a non-copper containing barrier layer deposited on said metallic layer, the barrier layer comprising a material which prevents reaction and interdiffusion between copper and silicon; and a copper alloy metallization film deposited on said barrier layer.

* * * * *